United States Patent
Li et al.

(10) Patent No.: US 11,398,548 B2
(45) Date of Patent: Jul. 26, 2022

(54) SEMICONDUCTOR DEVICE

(71) Applicant: United Microelectronics Corp., Hsinchu (TW)

(72) Inventors: Wen-Shen Li, Singapore (SG); Ching-Yang Wen, Pingtung County (TW); Purakh Raj Verma, Singapore (SG); Xingxing Chen, Singapore (SG); Chee-Hau Ng, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/124,124

(22) Filed: Dec. 16, 2020

(65) Prior Publication Data

US 2021/0104602 A1 Apr. 8, 2021

Related U.S. Application Data

(62) Division of application No. 16/017,840, filed on Jun. 25, 2018, now Pat. No. 10,903,314.

(30) Foreign Application Priority Data

May 16, 2018 (CN) .......................... 201810466671.5

(51) Int. Cl.
*H01L 29/06* (2006.01)
*H01L 23/528* (2006.01)
(Continued)

(52) U.S. Cl.
CPC .... *H01L 29/0649* (2013.01); *H01L 21/30604* (2013.01); *H01L 21/31111* (2013.01);
(Continued)

(58) Field of Classification Search
CPC ....... H01L 21/28518; H01L 21/823475; H01L 27/1203; H01L 21/76264
See application file for complete search history.

(56) References Cited

U.S. PATENT DOCUMENTS 6,720,242 B2 4/2004 Burbach et al.
8,415,250 B2 4/2013 Alptekin et al.
(Continued)

FOREIGN PATENT DOCUMENTS

| CN | 1622288 | 6/2005 |
|---|---|---|
| CN | 103946971 | 7/2014 |
| CN | 107301972 | 10/2017 |

OTHER PUBLICATIONS

"Office Action of China Counterpart Application", dated Feb. 10, 2021, p. 1-p. 6.

*Primary Examiner* — Bac H Au

(74) *Attorney, Agent, or Firm* — J.C. Patents

(57) ABSTRACT

A semiconductor device and a method for manufacturing the semiconductor device are provided. The semiconductor device includes an insulating layer, a semiconductor layer, a plurality of isolation structures, a transistor, a first contact, a plurality of silicide layers, and a protective layer. The semiconductor layer is disposed on a front side of the insulating layer. The plurality of isolation structures are disposed in the semiconductor layer. The transistor is disposed on the semiconductor layer. The first contact is disposed beside the transistor and passes through one of the plurality of isolation structures and the insulating layer therebelow. The plurality of silicide layers are respectively disposed on a bottom surface of the first contact and disposed on a source, a drain, and a gate of the transistor. The protective layer is disposed between the first contact and the insulating layer.

8 Claims, 8 Drawing Sheets

(51) Int. Cl.
  *H01L 23/522* (2006.01)
  *H01L 21/768* (2006.01)
  *H01L 21/306* (2006.01)
  *H01L 21/311* (2006.01)
  *H01L 21/285* (2006.01)

(52) U.S. Cl.
  CPC .. *H01L 21/76802* (2013.01); *H01L 21/76831* (2013.01); *H01L 21/76898* (2013.01); *H01L 23/528* (2013.01); *H01L 23/5226* (2013.01); *H01L 21/28518* (2013.01)

(56) References Cited

U.S. PATENT DOCUMENTS

| | | | |
|---|---|---|---|
| 8,790,975 B2* | 7/2014 | Baars | H01L 21/28 438/243 |
| 9,780,210 B1* | 10/2017 | Goktepeli | H01L 21/76898 |
| 9,812,580 B1* | 11/2017 | Goktepeli | H01L 21/76251 |
| 9,887,159 B1 | 2/2018 | Zhu | |
| 11,081,394 B2* | 8/2021 | Shieh | H01L 21/823431 |
| 2002/0045298 A1* | 4/2002 | Takahashi | H01L 21/743 438/149 |
| 2002/0185738 A1 | 12/2002 | Kim et al. | |
| 2003/0094654 A1* | 5/2003 | Christensen | H01L 21/76243 257/347 |
| 2004/0217421 A1* | 11/2004 | Aminpur | H01L 21/84 257/347 |
| 2004/0241917 A1 | 12/2004 | Schwan et al. | |
| 2005/0118779 A1 | 6/2005 | Ahn | |
| 2006/0197154 A1* | 9/2006 | Pelella | H01L 21/84 257/347 |
| 2007/0238244 A1 | 10/2007 | Lin et al. | |
| 2008/0203379 A1 | 8/2008 | Magistretti et al. | |
| 2009/0194844 A1* | 8/2009 | Richter | H01L 27/1087 257/532 |
| 2010/0084736 A1 | 4/2010 | Dang et al. | |
| 2011/0260248 A1 | 10/2011 | Smeys et al. | |
| 2014/0327093 A1 | 11/2014 | Lo et al. | |
| 2015/0061020 A1* | 3/2015 | Yokoyama | H01L 43/10 257/347 |
| 2017/0301611 A1 | 10/2017 | Cheng et al. | |
| 2018/0040511 A1* | 2/2018 | Kamineni | H01L 29/41741 |
| 2018/0076145 A1* | 3/2018 | Goktepeli | H01L 21/84 |
| 2019/0051666 A1 | 2/2019 | Li et al. | |

* cited by examiner

SEMICONDUCTOR DEVICE

CROSS-REFERENCE TO RELATED APPLICATION

This is a divisional application of and claims the priority benefit of U.S. application Ser. No. 16/017,840, filed on Jun. 25, 2018, now allowed, which claims the priority benefit of China application serial no. 201810466671.5, filed on May 16, 2018. The entirety of each of the above-mentioned patent applications is hereby incorporated by reference herein and made a part of this specification.

BACKGROUND OF THE INVENTION

Field of the Invention

The disclosure relates to an integrated circuit and a method for manufacturing the integrated circuit, and in particular, to a semiconductor device and a method for manufacturing the semiconductor device.

Description of Related Art

As the demand for high-performance circuits increases, the semiconductor-on-insulator (SOI) technique has attracted much attention because the conventional bulk metal-oxide-semiconductor field-effect transistor (MOSFET) structure cannot overcome issues such as short-channel effects, parasitic capacitance, and current leakage.

In the SOI technique, a MOSFET device is formed on a semiconductor layer, and a buried oxide (hereinafter referred to as BOX) layer is disposed between the semiconductor layer and a substrate. The technique provides a number of advantages over the conventional bulk MOSFET devices. For example, a SOI MOSFET device has a smaller parasitic capacitance and thus exhibits more desirable speed properties in circuit operations. Moreover, with the BOX layer, latch-up effects can be prevented. In addition, as the short-channel effects have less impact on the SOI MOSFET device, it is easier to scale down the device. With the advantages of enhanced operation speed, high packaging density, and low power consumption, it is expected that the SOI MOSFET device will become the mainstream device structure. However, there are still some challenges in the SOI MOSFET device to overcome.

SUMMARY OF THE INVENTION

The embodiments of the invention provide a semiconductor device in which a silicide layer is disposed between a backside contact and a backside interconnect structure, which solves the issue of metal loss of the backside contact and significantly reduces the charging effect of the semiconductor device.

The embodiments of the invention provide a method for manufacturing a semiconductor device that can simplify the manufacturing process and reduce the cycle time, which further enhances commercial competitiveness of the semiconductor device.

A semiconductor device according to an embodiment of the invention includes an insulating layer, a semiconductor layer, a plurality of isolation structures, a transistor, a first contact, a plurality of silicide layers, and a protective layer. The insulating layer has a front side and a back side opposite to each other. The semiconductor layer is disposed on the front side of the insulating layer. The plurality of isolation structures are disposed in the semiconductor layer. The transistor is disposed on the semiconductor layer. The first contact is disposed beside the transistor and passes through one of the plurality of isolation structures and the insulating layer therebelow. The plurality of silicide layers are respectively disposed on a bottom surface of the first contact and disposed on a source, a drain, and a gate of the transistor. The protective layer is disposed between the first contact and the insulating layer.

In an embodiment of the invention, the plurality of isolation structures divide the semiconductor layer into a plurality of semiconductor regions, and the transistor is disposed on one of the plurality of semiconductor regions of the semiconductor layer.

In an embodiment of the invention, the semiconductor device further includes: an interlayer dielectric layer disposed on the semiconductor layer; a plurality of second contacts disposed in the interlayer dielectric layer to be electrically connected to the source, the drain, and the gate of the transistor, respectively; and a first interconnect structure disposed on the interlayer dielectric layer to be electrically connected to the first contact and the plurality of second contacts, respectively.

In an embodiment of the invention, the semiconductor device further includes: a second interconnect structure disposed on the back side of the insulating layer and electrically connected to the first contact through one of the plurality of silicide layers.

In an embodiment of the invention, the semiconductor device further includes: a third contact disposed on another of the plurality of semiconductor regions of the semiconductor layer and partially passing through the another of the plurality of semiconductor regions of the semiconductor layer. The second interconnect structure is electrically connected to the third contact through another of the plurality of silicide layers disposed at a bottom portion of the third contact.

In an embodiment of the invention, the protective layer extends from a space between the first contact and the insulating layer and covers top surfaces of the plurality of isolation structures and a top surface of the semiconductor layer.

In an embodiment of the invention, the plurality of silicide layers includes a metal silicide, and the metal silicide includes nickel silicide (NiSi), cobalt silicide (CoSi), titanium silicide (TiSi), or a combination thereof.

A method for manufacturing a semiconductor device according to an embodiment of the invention includes the following steps. A substrate with an insulating layer formed thereon is provided. A semiconductor layer is formed on a front side of the insulating layer. A plurality of isolation structures are formed in the semiconductor layer. A transistor is formed on the semiconductor layer. A first opening is formed. The first opening passes through one of the plurality of isolation structures and the insulating layer therebelow to expose a top surface of the substrate. A first silicide layer is formed on a bottom surface of the first opening and simultaneously, a plurality of second silicide layers are formed on a source, a drain, and a gate of the transistor, respectively. A protective layer is conformally formed on the substrate.

In an embodiment of the invention, the step of forming the first opening includes the following steps. A hard mask layer is formed on the substrate. The hard mask layer is patterned to expose a top surface of one of the plurality of isolation structures. A portion of the one of the plurality of isolation structures and a portion of the insulating layer therebelow are removed by using the patterned hard mask layer as a mask to expose the top surface of the substrate.

In an embodiment of the invention, after conformally forming the protective layer on the substrate, the method further includes the following steps. An interlayer dielectric layer is formed on the protective layer. A second opening is formed in the interlayer dielectric layer and the protective layer to connect to the first opening. A first contact is formed in the first opening and the second opening.

In an embodiment of the invention, the step of forming the second opening in the interlayer dielectric layer includes the following steps. A portion of the interlayer dielectric layer is removed by using the protective layer as an etching stop layer to expose the protective layer on the first opening. The protective layer on the bottom surface of the first opening is removed by using the first silicide layer as an etching stop layer to expose the first silicide layer, so that a remaining protective layer is formed on sidewalls of the first opening in a form of a spacer.

In an embodiment of the invention, the step of forming the second opening in the interlayer dielectric layer and the protective layer includes the following step. A plurality of third openings are simultaneously formed in the interlayer dielectric layer and the protective layer to expose the plurality of second silicide layers on the source, the drain, and the gate of the transistor.

In an embodiment of the invention, the step of forming the first contact in the first opening and the second opening includes the following step. A plurality of second contacts are simultaneously formed in the plurality of third openings.

In an embodiment of the invention, the plurality of isolation structures divide the semiconductor layer into a plurality of semiconductor regions, and the transistor is formed on one of the plurality of semiconductor regions of the semiconductor layer.

In an embodiment of the invention, after forming the transistor, the method further includes the following steps. A portion of another of the plurality of semiconductor regions of the semiconductor layer is recessed to form a recess in the another of the plurality of semiconductor regions of the semiconductor layer. A third silicide layer is simultaneously formed in the recess when the first silicide layer is formed on the bottom surface of the first opening.

In an embodiment of the invention, when the second opening is formed in the interlayer dielectric layer and the protective layer, the method includes the following step. A fourth opening is formed in the interlayer dielectric layer and the protective layer to expose a top surface of the third silicide layer.

In an embodiment of the invention, when the first contact is formed in the first opening and the second opening, the method includes the following step. A third contact is simultaneously formed in the fourth opening.

In an embodiment of the invention, after forming the first contact in the first opening and the second opening, the method further includes the following steps. A first interconnect structure is formed on the interlayer dielectric layer to be electrically connected to the first contact and the third contact, respectively. The substrate is removed to expose a back side of the insulating layer and a bottom surface of the first silicide layer. A second interconnect structure is formed on the back side of the insulating layer to be electrically connected to the first contact and the third contact, respectively.

In an embodiment of the invention, the step of removing the substrate includes the following step. A wet etching process is performed. The wet etching process includes using an etching solution containing tetramethylammonium hydroxide.

In an embodiment of the invention, an etching selectivity of the wet etching process for the substrate with respect to the first silicide layer is greater than 150:1.

In light of the above, in the embodiments of the invention, the silicide layer is formed between the first contact and the second interconnect structure to solve the issue of metal loss of the first contact. Moreover, the silicide layers are respectively disposed between the first contact and the second interconnect structure and between the third contact and the second interconnect structure to discharge the charge accumulated in the first interconnect structure, which significantly reduces the charging effect of the semiconductor device. In addition, the method for manufacturing the semiconductor device of the embodiments of the invention can simplify the manufacturing process and reduce the cycle time, which further enhances commercial competitiveness of the semiconductor device.

To provide a further understanding of the aforementioned and other features and advantages of the disclosure, exemplary embodiments, together with the reference drawings, are described in detail below.

DESCRIPTION OF THE EMBODIMENTS

Figure 1A:
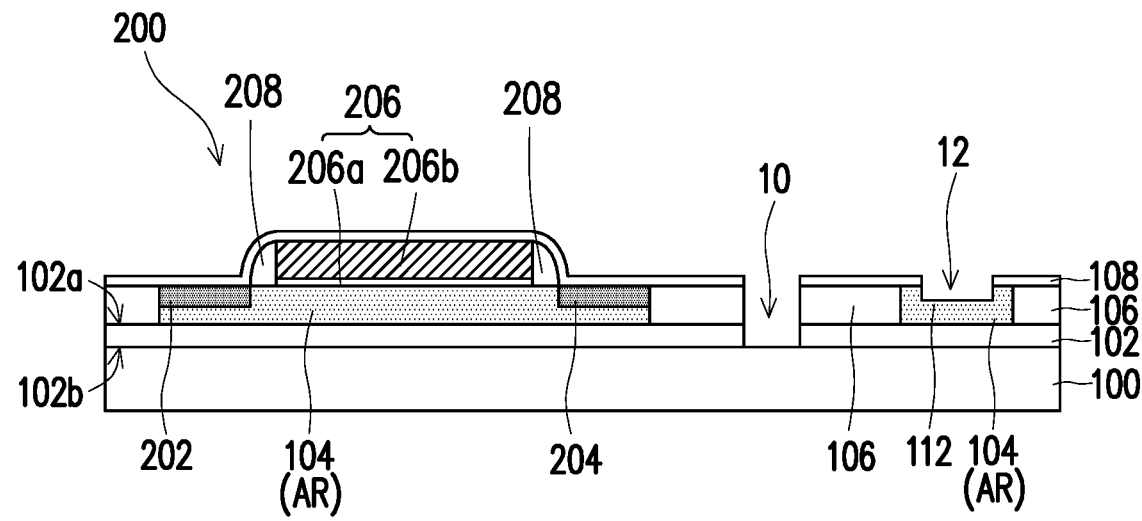
FIG. 1A to FIG. 1H are cross-sectional schematic diagrams illustrating a manufacturing process of a semiconductor device according to a first embodiment of the invention.

The invention will be described in detail with reference to the drawings of the embodiments. However, the invention may also be implemented in various different forms and shall not be limited to the embodiments described herein. Thicknesses of layers and regions in the drawings are exaggerated for clarity. The same or similar numerals represent the same or similar components, which will not be repeatedly described in subsequent paragraphs.

FIG. 1A to FIG. 1H are cross-sectional schematic diagrams illustrating a manufacturing process of a semiconductor device according to a first embodiment of the invention. In the present embodiment, the semiconductor device may be a semiconductor device manufactured according to a radio frequency (RF) SOI technique, but the invention is not limited hereto.

Referring to FIG. 1A, a substrate 100 with an insulating layer 102 formed thereon is provided. The insulating layer 102 has a front side 102a and a back side 102b opposite to each other. The back side 102b of the insulating layer 102 is close to and in contact with the substrate 100. In an embodiment, the substrate 100 includes a semiconductor substrate, such as a silicon substrate. In an embodiment, a material of the insulating layer 102 includes an oxide, such as a silicon oxide layer. A thickness of the insulating layer 102 ranges from 500 Å to 1500 Å and is, for example, about 800 Å.

Next, a semiconductor layer 104 is formed on the front side 102a of the insulating layer 102. In an embodiment, the semiconductor layer 104 may include an epitaxial layer, such as a silicon epitaxial layer. A thickness of the semiconductor layer 104 ranges from 300 Å to 1000 Å and is, for example, about 500 Å. In the present embodiment, a composite structure of the substrate 100, the insulating layer 102, and the semiconductor layer 104 may be regarded as a SOI substrate.

Then, a plurality of isolation structures 106 are formed in the semiconductor layer 104 to divide the semiconductor layer 104 into a plurality of semiconductor regions (or active regions) AR (hereinafter referred to as active regions AR). In an embodiment, the isolation structure 106 is, for example, a shallow trench isolation (STI) structure, and a material of the isolation structure 106 includes an insulating material. The insulating material may be silicon oxide, silicon nitride, or a combination thereof. A thickness of the isolation structure 106 ranges from 300 Å to 1000 Å and is, for example, about 500 Å.

Referring to FIG. 1A, a transistor 200 is formed on the active region AR of the semiconductor layer 104. Specifically, the transistor 200 includes doped regions 202, 204, a gate structure 206, and a spacer 208. The gate structure 206 is disposed on the semiconductor region AR. The gate structure 206 includes a gate dielectric layer 206a and a gate 206b. The gate dielectric layer 206a is disposed between the gate 206b and the active region AR to electrically isolate the gate 206b from the active region AR. In an embodiment, a material of the gate dielectric layer 206a includes silicon oxide, and a formation method of the gate dielectric layer 206a includes thermal oxidation or chemical vapor deposition (CVD). A material of the gate 206b includes polycrystalline silicon, and a formation method of the gate 206b includes CVD. The spacer 208 is disposed on the active region AR at two sides of the gate structure 206. A formation method of the spacer 208 is familiar to people skilled in the art and shall not be detailed here. The doped regions 202, 204 are respectively disposed in the active region AR at two sides of the gate structure 206. A formation method of the doped regions 202, 204 includes, for example, performing an ion implanting process by using the gate structure 206 and the spacer 208 as a mask to implant a dopant into the active region AR. In an embodiment, the doped region 202 may be a source, and the doped region 204 may be a drain. However, the invention is not limited hereto. In other embodiments, the doped region 202 may also be a drain, and the doped region 204 may also be a source. In some embodiments, the doped regions 202, 204 are of the same conductivity type. For example, the doped regions 202, 204 may be of N-type conductivity, so that the transistor 200 is an N-type transistor. On the other hand, the doped regions 202, 204 may also be of P-type conductivity, so that the transistor 200 is a P-type transistor. In an alternative embodiment, the transistor 200 includes an RF transistor, but the invention is not limited hereto.

Then, as shown in FIG. 1A, a patterned hard mask layer 108 is formed on the substrate 100. Specifically, a hard mask layer (not illustrated) is first formed on the substrate 100 to conformally cover the transistor 200, a top surface of the semiconductor layer 104, and top surfaces of the isolation structures 106. The hard mask layer is then patterned to expose part of the top surfaces of the isolation structures 106. In an embodiment, the step of patterning the hard mask layer includes forming a photoresist pattern (not illustrated) on the substrate 100, and then removing part of the hard mask layer by using the photoresist pattern as a mask.

Next, an etching process is performed by using the patterned hard mask layer 108 as a mask to remove a portion of the isolation structure 106 and a portion of the insulating layer 102 therebelow to form a first opening 10. The first opening 10 passes through the isolation structure 106 and the insulating layer 102 therebelow to expose a top surface of the substrate 100. In an embodiment, the etching process includes a dry etching process, such as a reactive ion etching (RIE) process.

It is noted that, after the transistor 200 is formed, a portion of the active region AR of the semiconductor layer 104 may also be recessed or etched to form a recess 12 in the active region AR of the semiconductor layer 104. As shown in FIG. 1A, the recess 12 partially passes through the semiconductor layer 104, such that there is still a distance between a bottom surface of the recess 12 and a top surface of the insulating layer 102. In an embodiment, the recess 12 may be formed before formation of the first opening 10. However, the invention is not limited hereto. In other embodiments, the recess 12 may also be formed after formation of the first opening 10. In an alternative embodiment, a depth of the first opening 10 is greater than a depth of the recess 12, but the invention is not limited hereto.

Figure 1B:
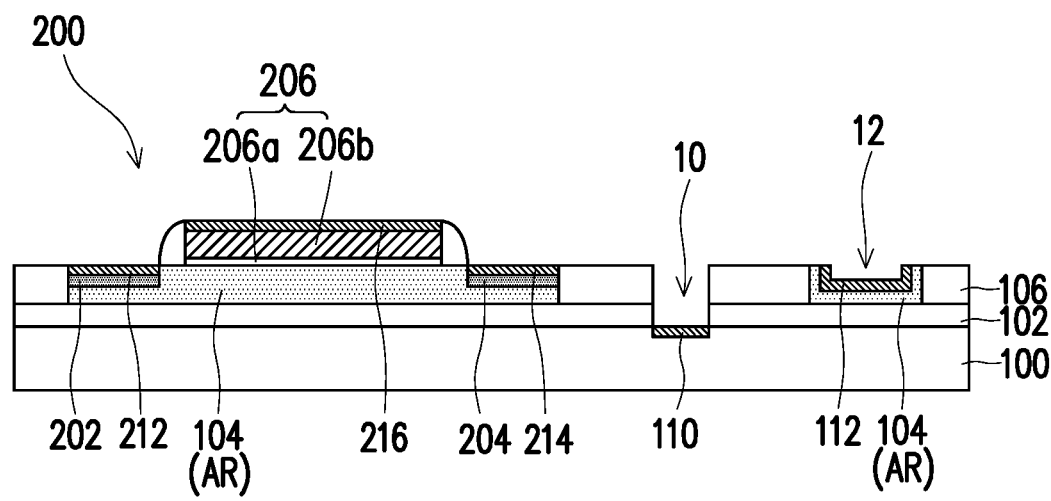

Referring to FIG. 1A and FIG. 1B, after the first opening 10 and the recess 12 are formed, the patterned hard mask layer 108 is removed from a region on which a silicide layer is to be formed, and the patterned hard mask layer 108 on a region which is undesired to form the silicide layer thereon is retained. In an embodiment, the region which the silicide layer is to be formed thereon is, for example, the active region, and the region which the silicide layer is undesired to be formed thereon is, for example, an input/output (I/O) region. Since the silicide layer will be formed on the region in FIG. 1B, the patterned hard mask layer 108 in the region of FIG. 1B is completely removed.

Next, referring to FIG. 1B, a silicide layer 110 (also referred to as a first silicide layer) is formed on a bottom surface of the first opening 10. At the same time, silicide layers 212, 212, 216 (also referred to as second silicide layers) are respectively formed on the doped regions 202, 204 and the gate structure 206 of the transistor 200. At the same time, a silicide layer 112 (also referred to as a third silicide layer) is formed in the recess 12. In an embodiment, a material of the silicide layers 110, 112, 212, 214, 216 includes a metal silicide, such as nickel silicide (NiSi), cobalt silicide (CoSi), titanium silicide (TiSi), or a combination thereof. A formation method of the silicide layers 110, 112, 212, 214, 216 is familiar to people skilled in the art and shall not be detailed here. It is noted that since the silicide layers are only formed on Si-containing materials, the silicide layers are not formed on the isolation structures 106. Moreover, the sidewalls and the bottom surface of the recess 12 are all defined by the semiconductor layer 104. Therefore, the silicide layer 112 is formed on the sidewalls and the bottom surface of the recess 12 to form a U-shape structure, while the silicide layers 110, 212, 214, 216 form linear structures. In addition, after the silicide layers 110, 112, 212, 214, 216 are formed, the patterned hard mask layer 108 (not illustrated in FIG. 1B) covering the region which the silicide layer is undesired to be formed thereon may be removed.

Figure 1C:
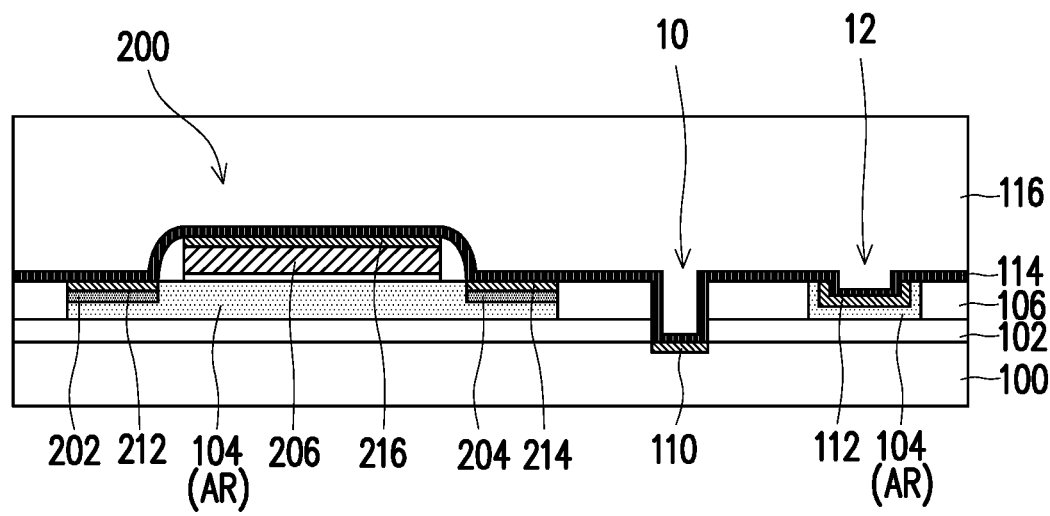

Referring to FIG. 1B and FIG. 1C, a protective layer 114 is conformally formed on the substrate 100. The protective layer 114 conformally covers the transistor 200, the top surfaces of the isolation structures 106, the surface of the first opening 10, and the surface of the recess 12. In an embodiment, a material of the protective layer 114 includes a nitride, such as silicon nitride, silicon oxynitride, or a combination thereof. A formation method of the protective layer 114 includes CVD or atomic layer deposition (ALD).

Next, an interlayer dielectric layer 116 is formed on the protective layer 114. In an embodiment, a material of the interlayer dielectric layer 116 includes a dielectric material, such as silicon oxide, silicon nitride, silicon oxynitride, or a combination thereof. A formation method of the interlayer dielectric layer 116 includes CVD. As shown in FIG. 1C, the interlayer dielectric layer 116 fills in (or fully fills in) the first opening 10 and the recess 12 and covers the transistor 200 and the top surfaces of the isolation structures 106.

Figure 1D:
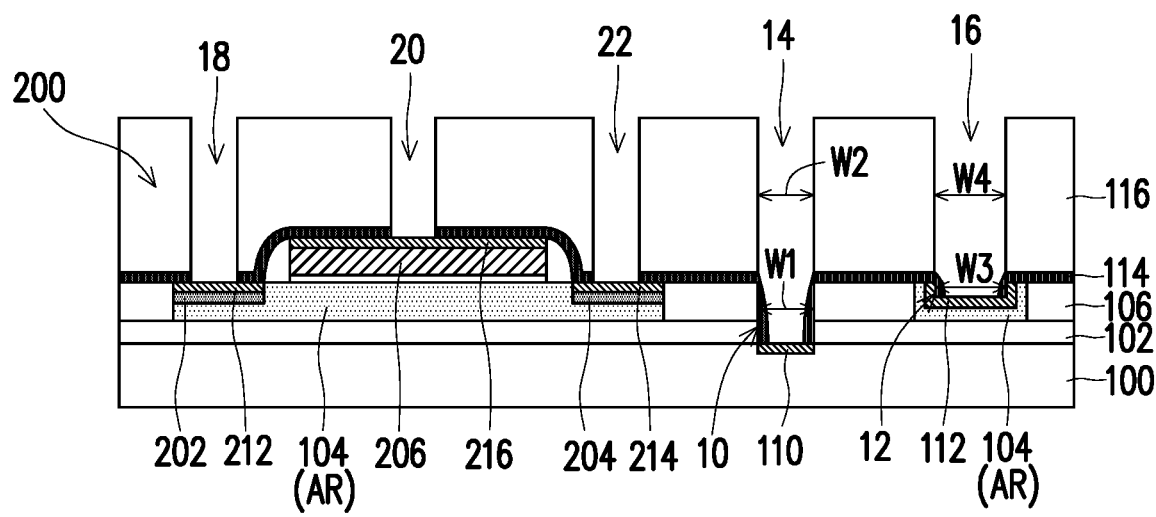

Referring to FIG. 1C and FIG. 1D, a second opening 14, third openings 18, 20, 22, and a fourth opening 16 are simultaneously formed in the interlayer dielectric layer 116 and the protective layer 114. As shown in FIG. 1D, the second opening 14 connects to the first opening 10 and exposes the silicide layer 110. The fourth opening 16 connects to the recess 12 and exposes the silicide layer 112. The third opening 18 exposes a portion of the silicide layer 212 on the doped region 202, the third opening 20 exposes a portion of the silicide layer 216 on the gate structure 206, and the third opening 22 exposes a portion of the silicide layer 214 on the doped region 204.

Specifically, formation of the second opening 14, the fourth opening 16, and the third openings 18, 20, 22 includes the following steps. A photoresist pattern (not illustrated) is formed on the interlayer dielectric layer 116. An etching process is performed by using the photoresist pattern as an etching mask and using the protective layer 114 as an etching stop layer to remove a portion of the interlayer dielectric layer 116. In an embodiment, the etching process includes a dry etching process, such as a RIE process.

After the etching process is performed, the protective layer 114 on the first opening 10 and the recess 12 is exposed, and part of the protective layer 114 on the silicide layers 212, 214, 216 is exposed. Since the protective layer 114 is used as the etching stop layer, the third opening 20 having a smaller depth may stop on the protective layer 114 until the interlayer dielectric layer 116 in the first opening 10 having a greater depth is completely removed. In this case, the second opening 14, the third openings 18, 20, 22, and the fourth opening 16 may have different depths.

After the second opening 14, the third openings 18, 20, 22, and the fourth opening 16 are formed, the protective layer 114 on the bottom surface of the first opening 10, the protective layer 114 on the recess 12, and the part of the protective layer 114 on the silicide layers 212, 214, 216 are further removed by using the silicide layers 110, 112, 212, 214, 216 as etching stop layers.

It is noted that when a width W1 of the first opening 10 is substantially equal to or smaller than a width W2 of the second opening 14, the protective layer 114 on the sidewalls of the first opening 10 will not be completely removed. As shown in FIG. 1D, the remaining protective layer 114 may be formed on the sidewalls of the first opening 10 in the form of a spacer. Similarly, when a width W3 of the recess 12 is substantially equal to or smaller than a width W4 of the fourth opening 16, the remaining protective layer 114 may also be formed on the sidewalls of the recess 12 in the form of a spacer. In an embodiment, the width W1 of the first opening 10 may range from 1000 Å to 5000 Å and is, for example, about 1500 Å. The width W2 of the second opening 14 may range from 1500 Å to 5000 Å and is, for example, about 2000 Å. The width W3 of the recess 12 may range from 1000 Å to 5000 Å and is, for example, about 1500 Å. The width W4 of the fourth opening 16 may range from 1500 Å to 5000 Å and is, for example, about 2000 Å.

Figure 1E:
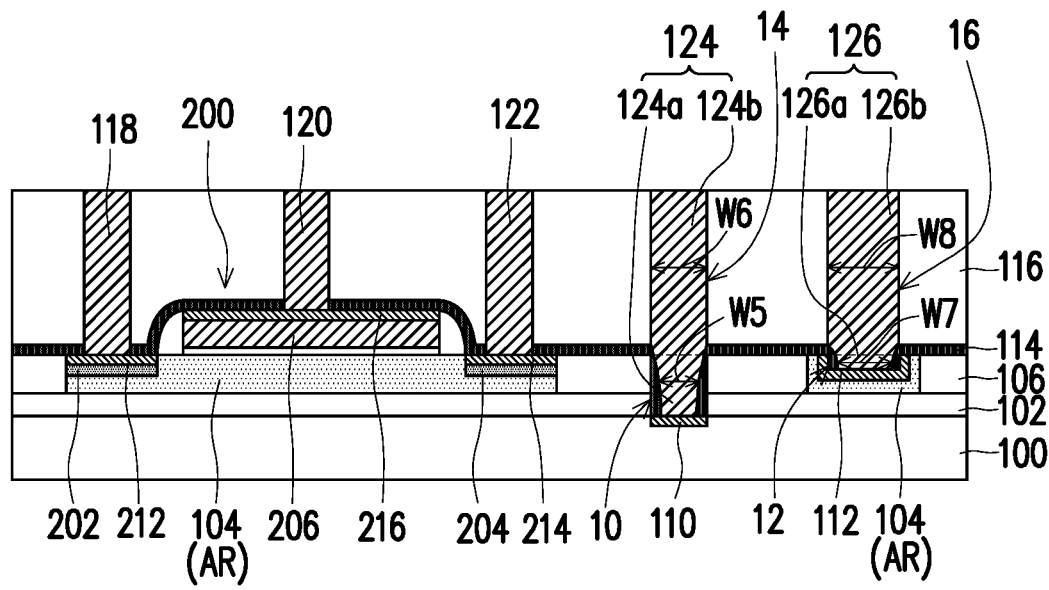

Referring to FIG. 1D and FIG. 1E, a first contact 124 is formed in the first opening 10 and the second opening 14. At the same time, second contacts 118, 120, 122 are formed in the third openings 18, 20, 22. At the same time, a third contact 126 is formed in the recess 12 and the fourth opening 16. As shown in FIG. 1E, the first contact 124 is disposed in the interlayer dielectric layer 116, the protective layer 114, and the isolation structure 106 beside the transistor 200, and the silicide layer 110 is disposed on a bottom surface of the first contact 124. The second contact 118 is electrically connected to the doped region 202 through the silicide layer 212. The second contact 120 is electrically connected to the gate structure 206 through the silicide layer 216. The second contact 122 is electrically connected to the doped region 204 through the silicide layer 214. The third contact 126 is disposed in the interlayer dielectric layer 116 and the protective layer 114 and partially passes through the active region AR of the semiconductor layer 104, and the silicide layer 112 is disposed at a bottom portion of the third contact 126.

Specifically, formation of the first contact 124, the second contacts 118, 120, 122 and the third contact 126 includes the following steps. A conductive material (not illustrated) is filled in the first opening 10, the second opening 14, the recess 12, the fourth opening 16, and the third openings 18, 20, 22 and covers the interlayer dielectric layer 116. Next, a planarization process is performed to remove the conductive material on the interlayer dielectric layer 116. In an embodiment, the planarization process is, for example, a chemical-mechanical polishing (CMP) method or an etch-back process. In an embodiment, the conductive material includes a metal material, such as tungsten (W), aluminum (Al), copper (Cu), or a combination thereof.

As shown in FIG. 1E, the first contact 124 includes a lower portion 124a located in the first opening 10 and an upper portion 124b located in the second opening 12. In an embodiment, a width W6 of the upper portion 124b is greater than or equal to a width W5 of the lower portion 124a. A ratio of the width W6 of the upper portion 124b to the width W5 of the lower portion 124a is, for example, 1.1 to 1.5. Similarly, the third contact 126 includes a lower portion 126a located in the recess 12 and an upper portion 126b located in the fourth opening 16. In an embodiment, a width W8 of the upper portion 126b is greater than or equal to a width W7 of the lower portion 126a. A ratio of the width W8 of the upper portion 126b to the width W7 of the lower portion 126a is, for example, 1.1 to 1.5. In an alternative embodiment, the second contacts 118, 120, 122 may include sidewalls substantially perpendicular to the top surface of the substrate 100. In other words, each of the second contacts 118, 120, 122 may be a cylindrical structure having the same or consistent width, but the invention is not limited hereto.

Moreover, as shown in FIG. 1E, the protective layer 114 is disposed between the first contact 124 and the insulating layer 102 and between the first contact 124 and the isolation structure 106 in the form of a spacer. Specifically, the protective layer 114 extends from a space between the first contact 124 and the insulating layer 102 to cover the top surfaces of the isolation structures 106 and the top surface of the semiconductor layer 104. On the other hand, the protective layer 114 is further disposed between the third contact 126 and the silicide layer 112 on the sidewalls of the recess 12.

Figure 1F:
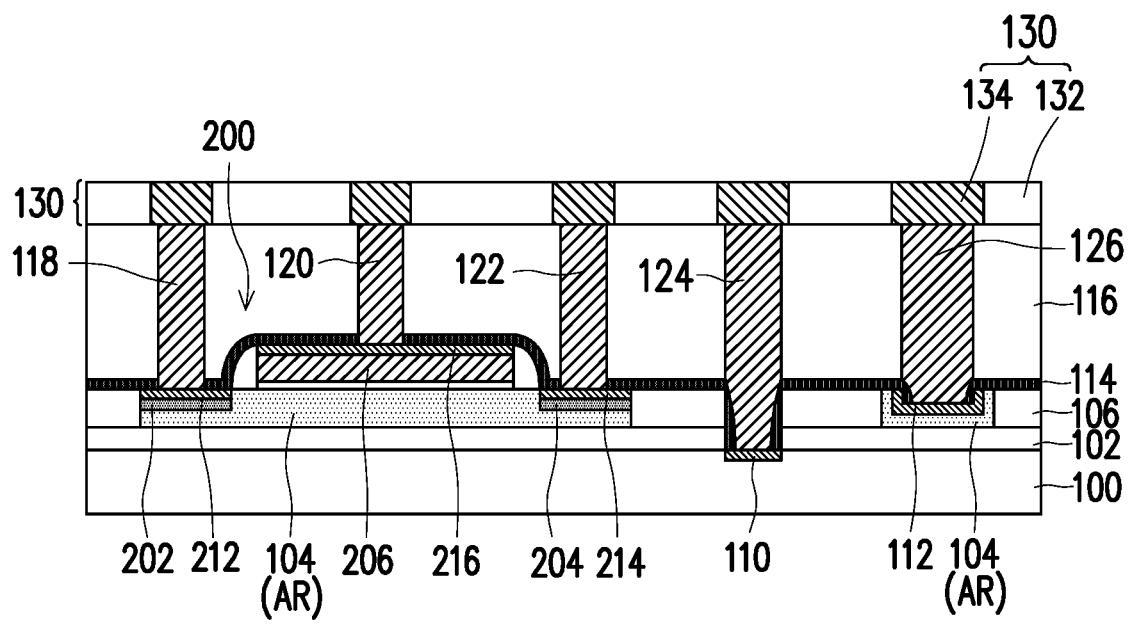

Referring to FIG. 1E and FIG. 1F, a first interconnect structure 130 is formed on the interlayer dielectric layer 116. Specifically, the first interconnect structure 130 includes a dielectric layer 132 and a circuit structure 134. The circuit structure 134 is disposed in the dielectric layer 132 to be electrically connected to the first contact 124, the second contacts 118, 120, 122, and the third contact 126, respectively. In an embodiment, a material of the dielectric layer 132 includes a dielectric material, such as silicon oxide, silicon nitride, silicon oxynitride, or a combination thereof. In an embodiment, a material of the circuit structure 134 includes a metal material, such as aluminum (Al), copper (Cu), or a combination thereof.

Figure 1G:
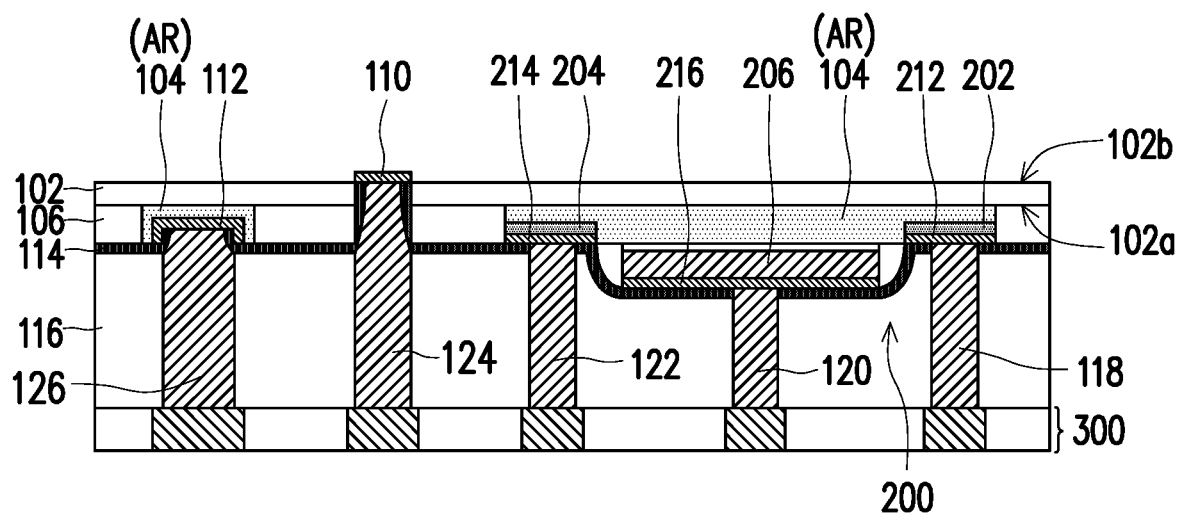

Referring to FIG. 1F and FIG. 1G, after the first interconnect structure 130 is formed, the substrate 100 is further removed to expose the back side 102b of the insulating layer 102 and a bottom surface of the silicide layer 110. Specifically, as shown in FIG. 1G, the first interconnect structure 130 is attached to a carrier (not illustrated), and the structure of FIG. 1F is turned upside down. Next, a wet etching process is performed to completely remove the substrate 100. In an embodiment, the wet etching process includes using an etching solution containing tetramethylammonium hydroxide (TMAH). The wet etching process (namely, using the etching solution containing TMAH) has a high etching selectivity for the substrate 100. In some embodiments, the etching selectivity of the wet etching process for the substrate 100 with respect to the silicide layer 110 (or the dielectric layer 102) is greater than 150:1. In other words, in the wet etching process, a large amount of the substrate 100 is removed, and none or only a small amount of the silicide layer 110 (or the dielectric layer 102) is removed. Therefore, the silicide layer 110 may be used to prevent the wet etching process from damaging the first contact 124 and further prevent metal loss of the first contact 124.

Figure 1H:
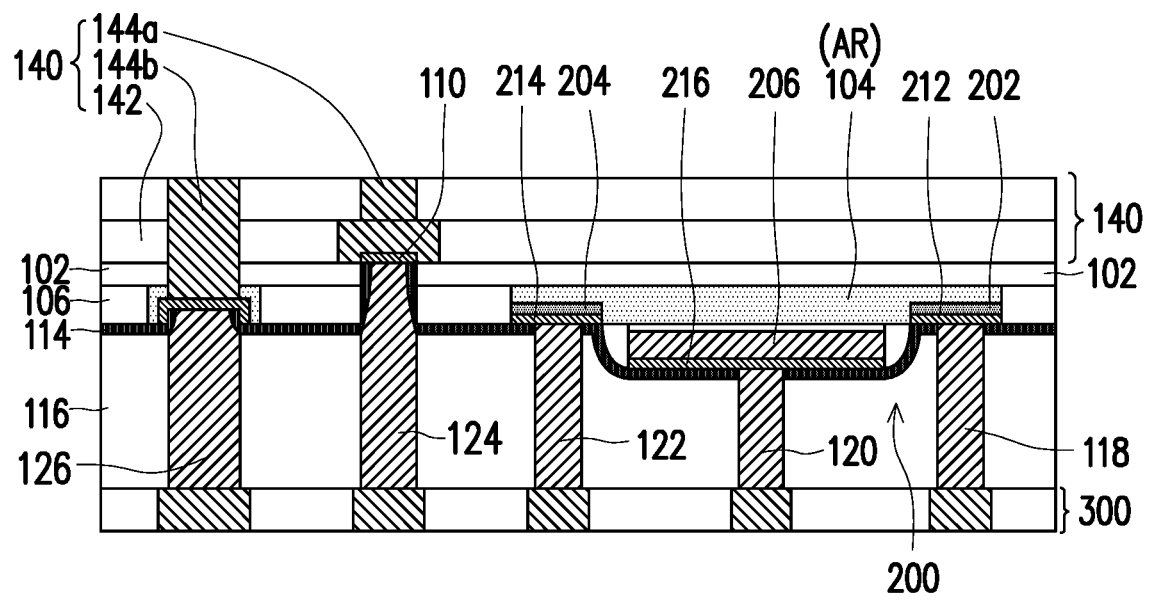

Referring to FIG. 1G and FIG. 1H, a second interconnect structure 140 is formed on the back side 102b of the insulating layer 102. Specifically, the second interconnect structure 140 includes a dielectric layer 142 and a circuit structure 144. The circuit structure 144 includes a first circuit structure 144a and a second circuit structure 144b. The first circuit structure 144a and the second circuit structure 144b are both disposed in the dielectric layer 142. The first circuit structure 144a is electrically connected to the first contact 124 through the silicide layer 110, and the second circuit structure 144b is electrically connected to the third contact 126 through the silicide layer 112. In an embodiment, a material of the dielectric layer 142 includes a dielectric material, such as silicon oxide, silicon nitride, silicon oxynitride, or a combination thereof. In an alternative embodiment, the dielectric layer 142 may be a monolayer structure or a multilayer structure. In an embodiment, a material of the circuit structure 144 includes a metal material, such as aluminum (Al), copper (Cu), or a combination thereof.

After the second interconnect structure 140 is formed, a semiconductor device 1 of the first embodiment is completed. Specifically, as shown in FIG. 1H, in the semiconductor device 1, the silicide layer 110 is formed between the first contact 124 and the second interconnect structure 140 to prevent the wet etching process from damaging the first contact 124 and further prevent metal loss of the first contact 124. Moreover, the silicide layer 110 is disposed between the first contact 124 and the second interconnect structure 140 and the silicide layer 112 is disposed between the third contact 126 and the second interconnect structure 140 to discharge the charge accumulated in the first interconnect structure 130, which significantly reduces the charging effect of the semiconductor device 1. Moreover, in the method for manufacturing the semiconductor device above, the silicide layers 110, 112, 212, 214, 216 are formed simultaneously, and the first contact 124, the second contacts 118, 120, 122, and the third contact 126 are also formed simultaneously. Therefore, the method for manufacturing the semiconductor device 1 of the embodiments of the invention can simplify the manufacturing process and reduce the cycle time, which further enhances commercial competitiveness of the semiconductor device 1.

It is noted that although the semiconductor device 1 includes the first contact 124 and the third contact 126 as backside contacts to electrically connect the first interconnect structure 130 and the second interconnect structure 140, the invention is not limited hereto. In other embodiments, it is possible that the semiconductor device 1 only includes the first contact 124 as the backside contact or only includes the third contact 126 as the backside contact.

FIG. 2A to FIG. 2H are cross-sectional schematic diagrams illustrating a manufacturing process of a semiconductor device according to a second embodiment of the invention.

Figure 2A:
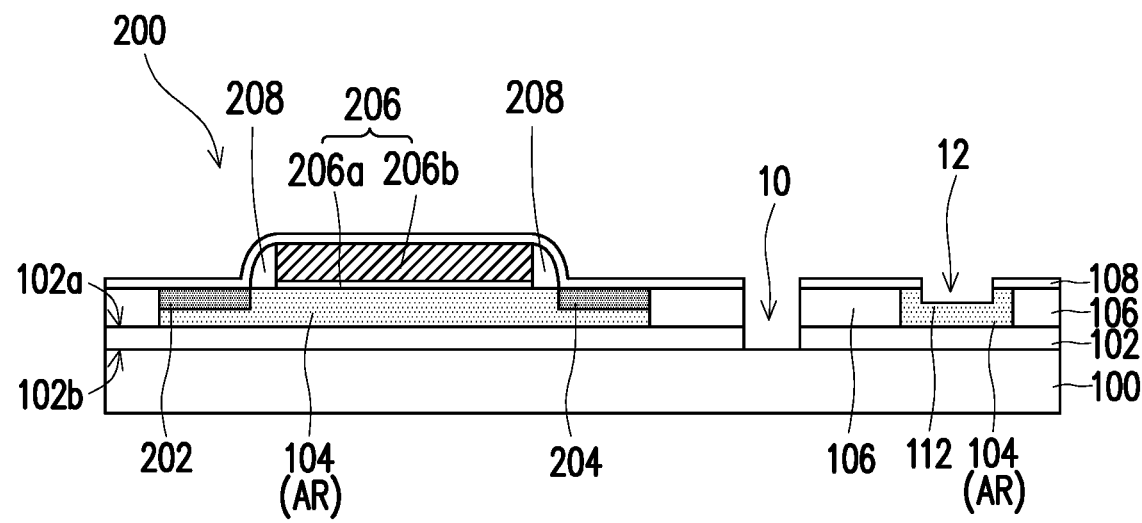
FIG. 2A to FIG. 2H are cross-sectional schematic diagrams illustrating a manufacturing process of a semiconductor device according to a second embodiment of the invention.
Figure 2B:
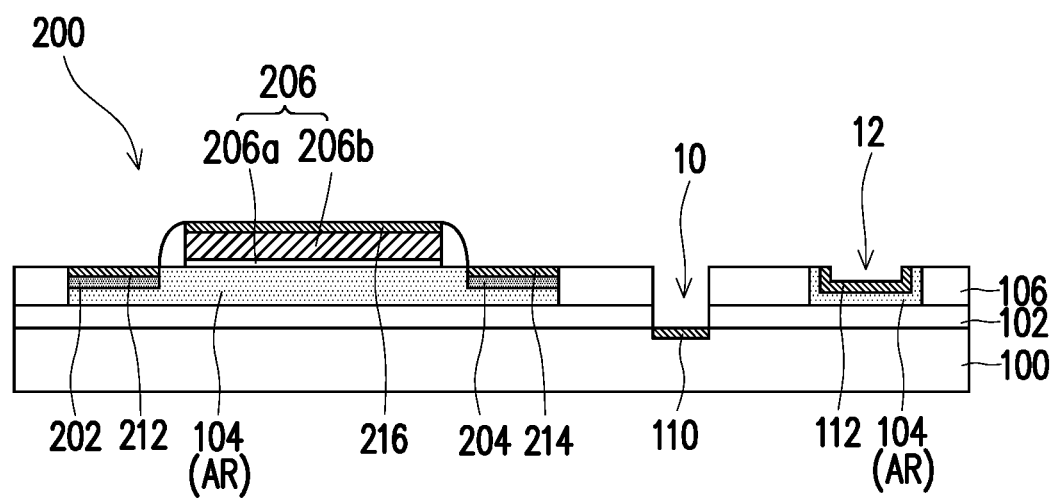
Figure 2C:
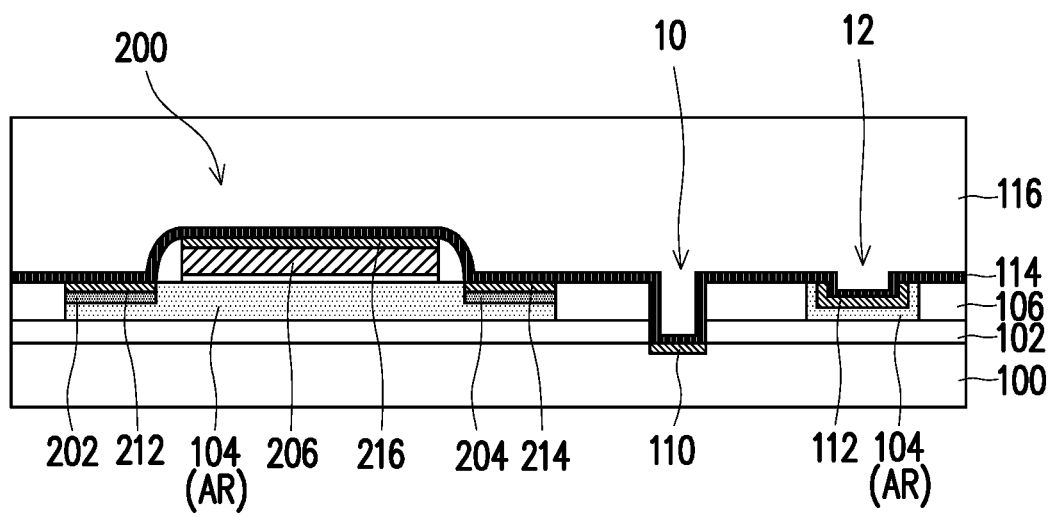
Figure 2D:
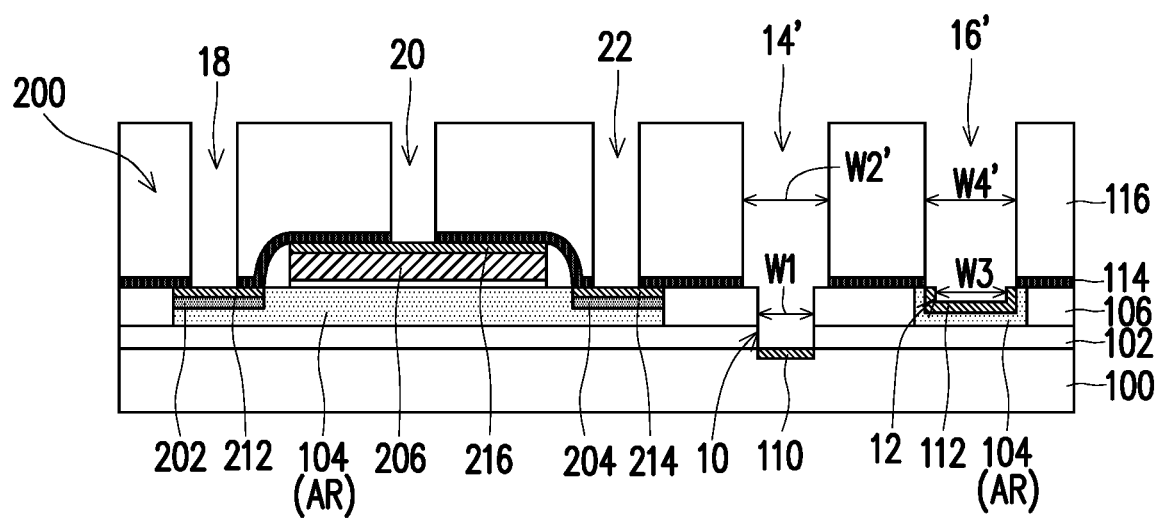
Figure 2E:
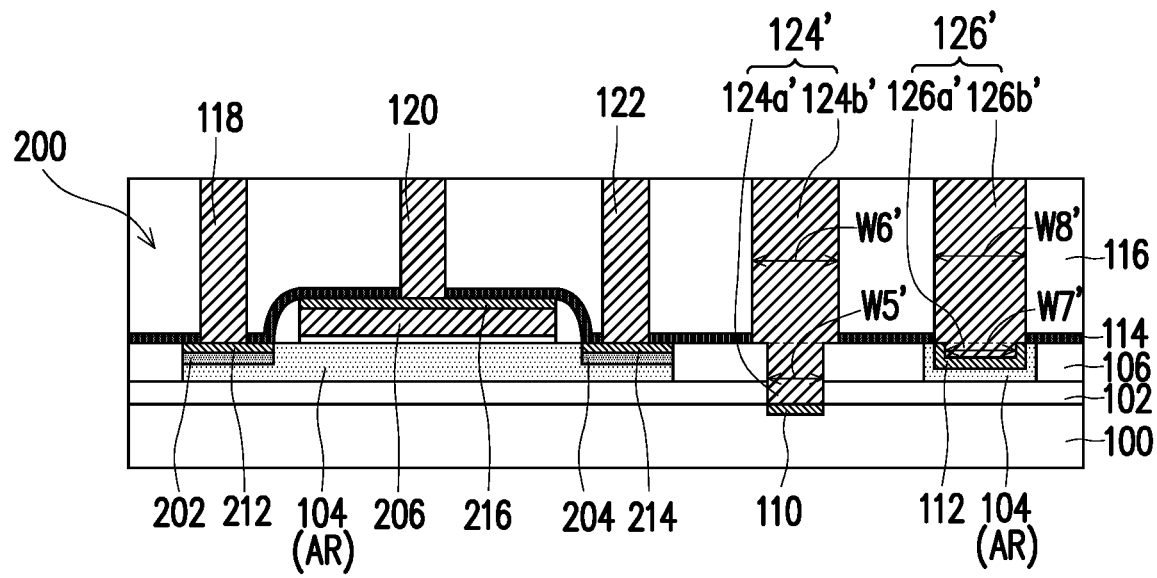
Figure 2F:
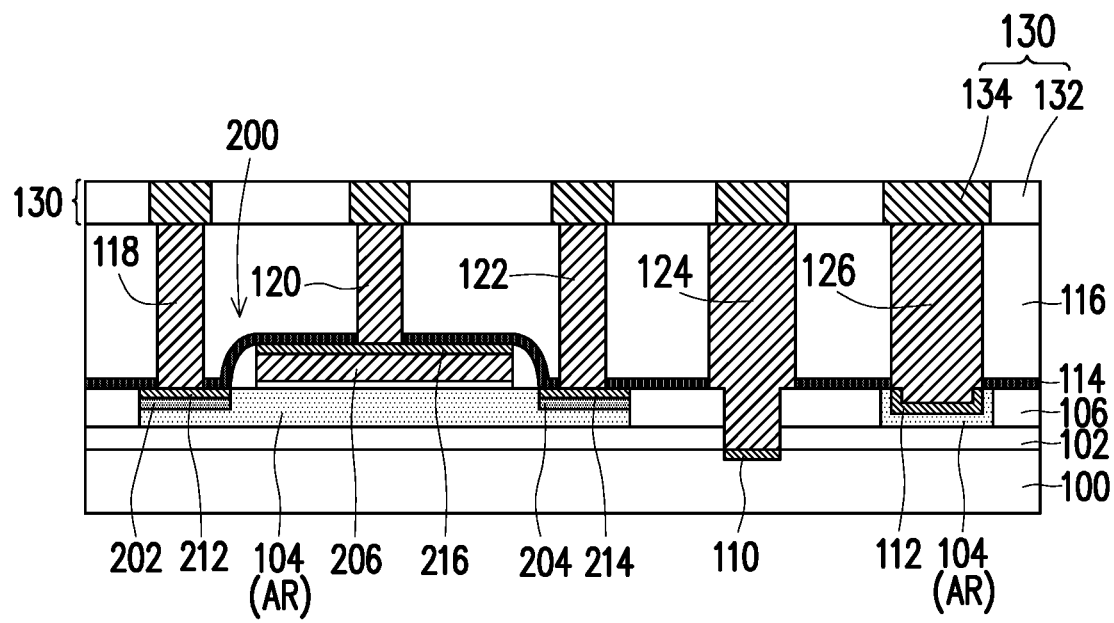
Figure 2G:
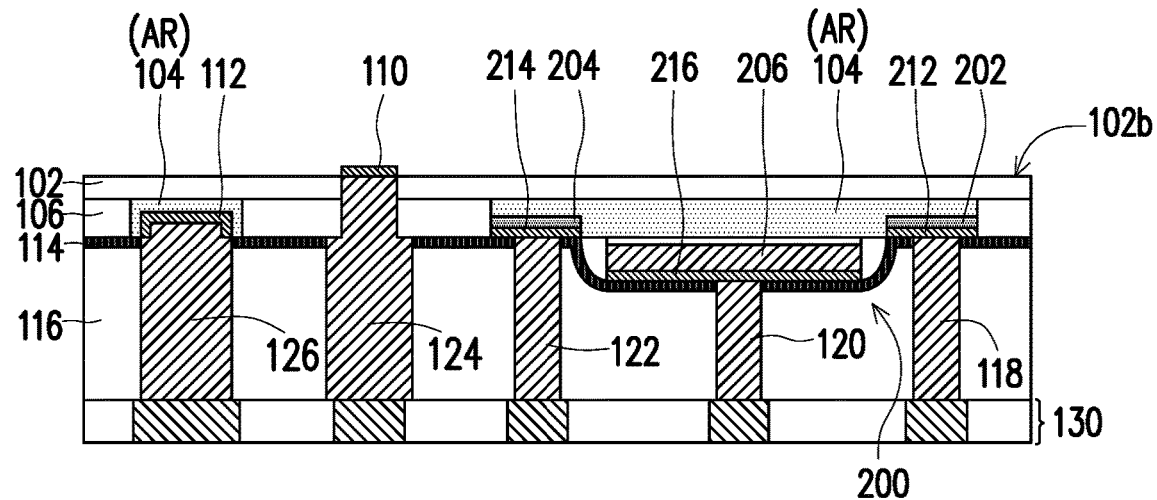
Figure 2H:
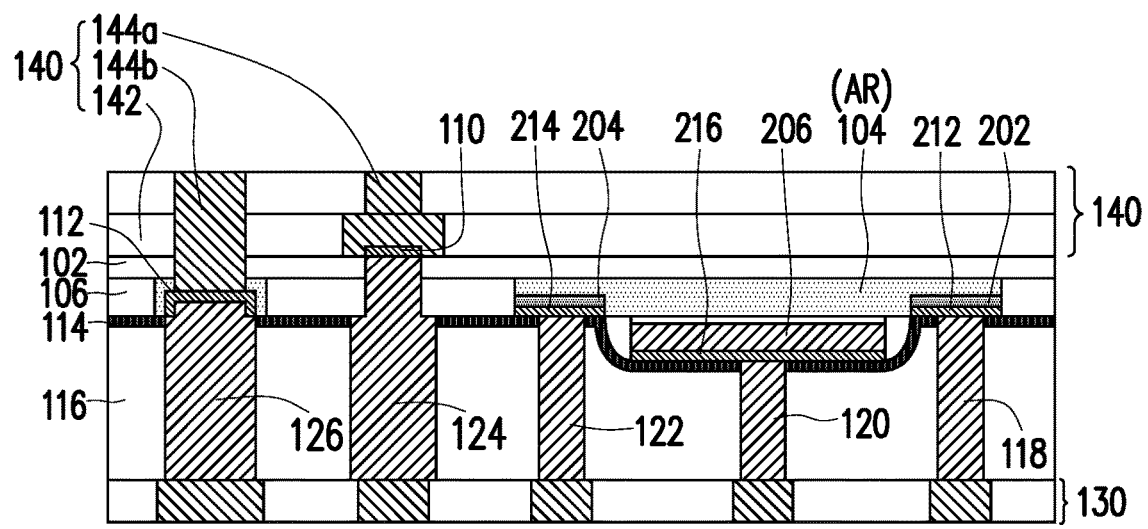

Referring to FIG. 2A and FIG. 2H, basically, a method for manufacturing a semiconductor device 2 of the second embodiment is similar to the method for manufacturing the semiconductor device 1 of the first embodiment and shall not be repeatedly described here. The difference between the two lies in that when a second opening 14' and a fourth opening 16' are simultaneously formed in the interlayer dielectric layer 116 and the protective layer 114, as shown in FIG. 2D, a width W2' of the second opening 14' is greater than the width W1 of the first opening 10, and a width W4' of the fourth opening 16' is also greater than the width W3 of the recess 12. Therefore, when the protective layer 114 on the bottom surface of the first opening 10 and the protective layer 114 on the recess 12 are removed by using the silicide layers 110, 112 as the etching stop layers, the protective layer 114 on the sidewalls of the first opening 10 and on the sidewalls of the recess 12 is also completely removed, as shown in FIG. 2D. In this case, as shown in FIG. 2E, a shape of a first contact 124' filled in the first opening 10 and the second opening 14' is also different from the shape of the first contact 124 of FIG. 1E. In an embodiment, a ratio of a width W6' of an upper portion 124b' of the first contact 124' to a width W5' of a lower portion 124a' of the first contact 124' ranges from 1.3 to 2.0. Similarly, as shown in FIG. 2E, a shape of a third contact 126' filled in the recess 12 and the fourth opening 16' is also different from the shape of the third contact 126 of FIG. 1E. In an alternative embodiment, a ratio of a width W8' of an upper portion 126b' of the third contact 126' to a width W7' of a lower portion 126a' of the third contact 126' ranges from 1.3 to 2.0.

In summary of the above, in the embodiments of the invention, the silicide layer is formed between the first contact and the second interconnect structure to solve the issue of metal loss of the first contact. Moreover, the silicide layers are respectively disposed between the first contact and the second interconnect structure and between the third contact and the second interconnect structure to discharge the charge accumulated in the first interconnect structure, which significantly reduces the charging effect of the semiconductor device. In addition, the method for manufacturing the semiconductor device of the embodiments of the invention can simplify the manufacturing process and reduce the cycle time, which further enhances commercial competitiveness of the semiconductor device.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A semiconductor device, comprising:
   an insulating layer, comprising a front side and a back side opposite to each other;
   a semiconductor layer, disposed on the front side of the insulating layer;
   a plurality of isolation structures, disposed in the semiconductor layer;
   a transistor, disposed on the semiconductor layer;
   a first contact, disposed beside the transistor and passing through one of the plurality of isolation structures and the insulating layer therebelow;
   a plurality of silicide layers, respectively disposed on a bottom surface of the first contact and disposed on a source, a drain, and a gate of the transistor; and
   a protective layer, disposed between the first contact and the insulating layer, so that the first contact has an upper portion and a lower portion, and a width of the lower portion is less than a width of the upper portion.

2. The semiconductor device according to claim 1, wherein the plurality of isolation structures divide the semiconductor layer into a plurality of semiconductor regions, and the transistor is disposed on one of the plurality of semiconductor regions of the semiconductor layer.

3. The semiconductor device according to claim 2, further comprising:
   an interlayer dielectric layer, disposed on the semiconductor layer;
   a plurality of second contacts, disposed in the interlayer dielectric layer to be electrically connected to the source, the drain, and the gate of the transistor, respectively; and
   a first interconnect structure, disposed on the interlayer dielectric layer to be electrically connected to the first contact and the plurality of second contacts, respectively.

4. The semiconductor device according to claim 2, further comprising:
   a second interconnect structure, disposed on the back side of the insulating layer and electrically connected to the first contact through one of the plurality of silicide layers.

5. The semiconductor device according to claim 4, further comprising:
   a third contact, disposed on another of the plurality of semiconductor regions of the semiconductor layer and partially passing through the another of the plurality of semiconductor regions of the semiconductor layer, wherein
   the second interconnect structure is electrically connected to the third contact through another of the plurality of silicide layers disposed at a bottom portion of the third contact.

6. The semiconductor device according to claim 1, wherein the protective layer extends from a space between the first contact and the insulating layer to cover top surfaces of the plurality of isolation structures and a top surface of the semiconductor layer.

7. The semiconductor device according to claim 1, wherein the plurality of silicide layers comprises a metal silicide, and the metal silicide comprises nickel silicide, cobalt silicide, titanium silicide, or a combination thereof.

8. A semiconductor device, comprising:
   an insulating layer, comprising a front side and a back side opposite to each other;
   a semiconductor layer, disposed on the front side of the insulating layer;
   a plurality of isolation structures, disposed in the semiconductor layer;
   a transistor, disposed on the semiconductor layer;
   a first contact, disposed beside the transistor and passing through one of the plurality of isolation structures and the insulating layer therebelow, wherein the first contact has an upper portion and a lower portion, the upper portion is higher than a top surface of the plurality of isolation structures, the lower portion is embedded in the one of the plurality of isolation structures and the insulating layer, and a width of the lower portion is less than a width of the upper portion;
   a plurality of silicide layers, respectively disposed on a bottom surface of the first contact and disposed on a source, a drain, and a gate of the transistor; and
   a protective layer, extending from a surface of the transistor to cover top surfaces of the plurality of isolation structures and a top surface of the semiconductor layer.

* * * * *